United States Patent
Egashira et al.

(10) Patent No.: US 10,122,390 B2
(45) Date of Patent: Nov. 6, 2018

(54) MODULATED SIGNAL GENERATING DEVICE AND WIRELESS DEVICE

(71) Applicant: Kabushiki Kaisha Toshiba, Minato-ku (JP)

(72) Inventors: Yoshimasa Egashira, Kawasaki (JP); Keiichi Yamaguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/391,324

(22) Filed: Dec. 27, 2016

(65) Prior Publication Data

US 2017/0237453 A1   Aug. 17, 2017

(30) Foreign Application Priority Data

Feb. 17, 2016   (JP) .................... 2016-028124

(51) Int. Cl.
*H03F 3/00* (2006.01)
*H04B 1/04* (2006.01)
(Continued)

(52) U.S. Cl.
CPC ............. *H04B 1/04* (2013.01); *H03F 1/32* (2013.01); *H03F 3/19* (2013.01); *H03F 3/211* (2013.01);
(Continued)

(58) Field of Classification Search
CPC .......... H04B 1/04; H04B 1/0475; H03F 3/19; H03F 3/211; H03F 1/32
See application file for complete search history.

(56) References Cited

U.S. PATENT DOCUMENTS 3,963,993 A * 6/1976 Hoffman .............. H03F 1/52
                                                         330/124 D
4,580,111 A * 4/1986 Swanson ............. H03F 3/2175
                                                         332/152
(Continued)

FOREIGN PATENT DOCUMENTS

| JP | 3545203 B2 | 4/2004 |
| JP | 2007-258768 A | 10/2007 |
| JP | 2016-144012 A | 8/2016 |

OTHER PUBLICATIONS

Z. Du et al., "Reduced Switching-Frequency Active Harmonic Elimination for Multilevel Converters," in IEEE Transactions on Industrial Electronics, vol. 55, No. 4, pp. 1761-1770, Apr. 2008.*

*Primary Examiner* — Berhanu Tadese
(74) *Attorney, Agent, or Firm* — Oblon, McClelland, Maier & Neustadt, L.L.P.

(57) ABSTRACT

A modulated signal generating device that modulates an input signal and generates a modulated signal. The modulated signal generating device includes a first to p-th amplifier, where p=3 to N, and N represents an integer equal to or greater than three, a first to p-th control unit, a first to p−1-th filter, and a combiner. The first amplifier generates a first amplified signal based on a first control signal. The first control unit generates the first control signal based on a first component signal included in the input signal. The first filter eliminates harmonic component included in a first difference signal representing difference between the input signal and the first component signal, and generates a first filtered signal. The combiner combines the first to a p-th amplified signal to generate the modulated signal.

8 Claims, 12 Drawing Sheets

(51) Int. Cl.
  *H03F 3/19* (2006.01)
  *H03F 3/21* (2006.01)
  *H03F 1/32* (2006.01)
  *H03F 3/217* (2006.01)
  *H03F 3/24* (2006.01)
  *H03F 3/72* (2006.01)
  *H03M 1/12* (2006.01)

(52) U.S. Cl.
  CPC .............. *H03F 3/2175* (2013.01); *H03F 3/24* (2013.01); *H03F 3/245* (2013.01); *H03F 3/72* (2013.01); *H04B 1/0475* (2013.01); *H03F 2200/111* (2013.01); *H03F 2200/171* (2013.01); *H03F 2200/451* (2013.01); *H03F 2203/21106* (2013.01); *H03F 2203/21142* (2013.01); *H03F 2203/7209* (2013.01); *H03M 1/12* (2013.01); *H04B 2001/0408* (2013.01); *H04B 2001/0491* (2013.01)

(56) References Cited

U.S. PATENT DOCUMENTS

| | | | | |
|---|---|---|---|---|
| 5,359,409 A * | 10/1994 | Wildnauer | ................ | G01J 3/18 356/328 |
| 5,454,013 A * | 9/1995 | Minami | .................... | H03C 1/02 332/159 |
| 5,483,197 A * | 1/1996 | Nishioka | ............... | H03F 1/0233 330/146 |
| 5,590,155 A * | 12/1996 | Yasuda | ............... | H04L 27/2092 332/103 |
| 6,175,512 B1 * | 1/2001 | Hagihara | ............... | H02M 7/493 323/906 |
| 6,208,286 B1 * | 3/2001 | Rostislavovich | .... | A61B 5/0507 342/118 |
| 6,236,284 B1 * | 5/2001 | Duello | ..................... | H03C 1/36 330/10 |
| 6,252,785 B1 | 6/2001 | Hagihara et al. | | |
| 6,681,101 B1 * | 1/2004 | Eidson | ................ | H03C 3/0925 455/126 |
| 6,804,500 B2 * | 10/2004 | Yamaguchi | ............. | H01L 24/49 330/124 R |
| 6,806,767 B2 * | 10/2004 | Dow | ........................ | H03F 1/14 330/129 |
| 7,555,054 B2 * | 6/2009 | Feher | ...................... | H04B 1/69 375/260 |
| 8,254,496 B2 * | 8/2012 | Takahashi | .............. | H03G 3/004 330/127 |
| 8,461,931 B1 * | 6/2013 | Bayruns | ................ | H03F 1/0244 330/127 |
| 9,209,758 B2 * | 12/2015 | Briffa | ................... | H03G 3/3042 |
| 2001/0027090 A1 * | 10/2001 | Uesugi | ................ | H03G 3/3042 455/126 |
| 2002/0055376 A1 * | 5/2002 | Norimatsu | .............. | H03F 3/211 455/127.1 |
| 2003/0162513 A1 * | 8/2003 | Saruwatari | ............ | H03F 1/0261 455/126 |
| 2005/0111574 A1 * | 5/2005 | Muller | ...................... | H03F 1/32 375/296 |
| 2005/0174175 A1 * | 8/2005 | Heigelmayer | ........ | H03F 1/0205 330/254 |
| 2006/0246855 A1 * | 11/2006 | Kato | .................... | H04B 1/0483 455/102 |
| 2007/0096804 A1 * | 5/2007 | Bakalski | ................... | H03F 1/56 330/51 |
| 2008/0037999 A1 * | 2/2008 | Masuda | .................... | H04B 1/69 398/186 |
| 2008/0051044 A1 * | 2/2008 | Takehara | .............. | H03F 1/0211 455/127.2 |
| 2009/0286495 A1 * | 11/2009 | Martikkala | ............. | H03F 3/602 455/115.1 |
| 2011/0260797 A1 * | 10/2011 | Lee | ........................ | H03F 3/211 330/295 |
| 2013/0162250 A1 * | 6/2013 | Sabate | ............... | G01R 33/3852 324/309 |
| 2014/0155122 A1 * | 6/2014 | Okazaki | .................. | H04B 1/0475 455/561 |
| 2014/0267488 A1 * | 9/2014 | Ready | ..................... | B41J 2/175 347/19 |
| 2014/0368251 A1 * | 12/2014 | Tanahashi | ............... | H03K 5/088 327/317 |
| 2015/0015329 A1 * | 1/2015 | Wilson | .................. | H03F 1/0277 330/251 |
| 2015/0035599 A1 * | 2/2015 | Chow | ..................... | H03F 3/193 330/277 |
| 2015/0222367 A1 * | 8/2015 | Olsson | .................. | H04B 10/64 398/115 |
| 2015/0318926 A1 * | 11/2015 | Zhang | ................ | H04B 10/2916 398/183 |
| 2016/0226685 A1 * | 8/2016 | Egashira | ............... | H04L 27/04 |

* cited by examiner

MODULATED SIGNAL GENERATING DEVICE AND WIRELESS DEVICE

CROSS-REFERENCE TO RELATED APPLICATIONS

This application is based upon and claims the benefit of priority from Japanese Patent Application No. 2016-028124, filed on Feb. 17, 2016; the entire contents of which are incorporated herein by reference.

FIELD

Embodiments described herein relate generally to a modulated signal generating device and a wireless device.

BACKGROUND

Among transmitters that generate modulated signals by superimposing data signals onto carrier signals and then transmit the generated modulated signals such as in broadcasting on medium-frequency; there are transmitters which generate modulated signals using a plurality of amplifiers having different amplification factors and then transmit the generated modulated signals. In such a transmitter, modulated signals are generated by performing ON/OFF control with respect to big step power amplifiers and binary power amplifiers.

However, in a transmitter, minute information portions of input signals are corrected in the binary power amplifiers. Hence, the speed of ON/OFF operations of the binary power amplifiers becomes fast, thereby leading to a possibility of an increase in the distortion of the modulated signals due to the high-speed operations. In order to reduce the distortion, it becomes necessary use a high-order bandpass filter, which may cause an increase in the circuit size.

DETAILED DESCRIPTION

According to an embodiment, the modulated signal generating device modulates an input signal and generates a modulated signal. The modulated signal generating device includes a first amplifier, a second amplifier, a combiner, a first control unit, a first filter and a second control unit. A first amplifier generates a first amplified signal based on a first control signal. A second amplifier has a smaller amplification factor as compared to the first amplifier and that generates a second amplified signal based on a second control signal. A combiner combines the first amplified signal and the second amplified signal and generates the modulated signal. A first control unit generates the first control signal based on a first component signal included in the input signal. A first filter eliminates harmonic component included in a first difference signal, which represents difference between the input signal and the first component signal, and generates a first filtered signal. A second control unit generates the second control signal based on a second component signal included in the first filtered signal.

Various embodiments will be described in detail below with reference to the accompanying drawings.

First Embodiment

Figure 1:
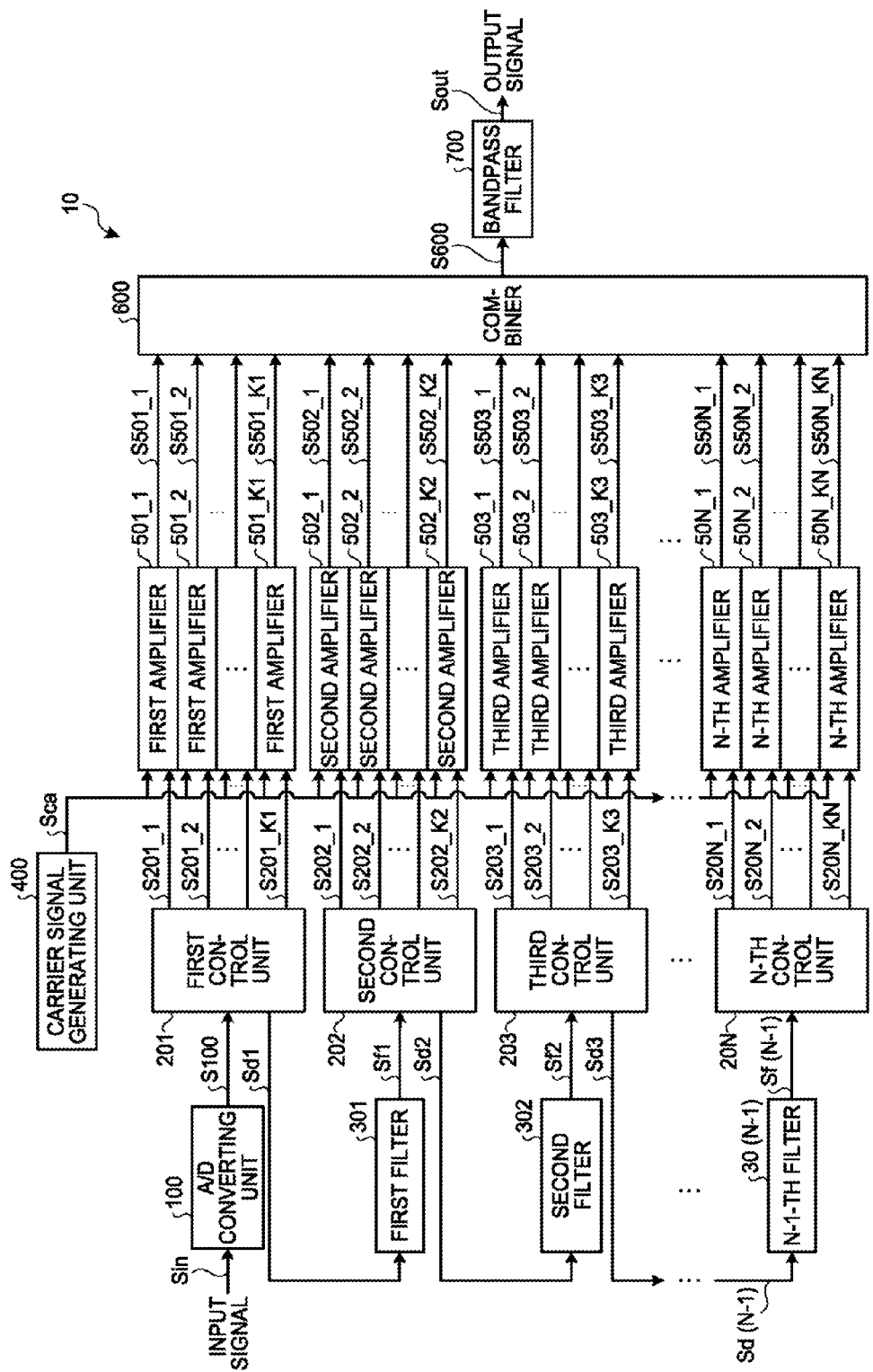
FIG. 1 is a block diagram illustrating a modulated signal generating device according to a first embodiment.

Explained below with reference to FIG. 1 is a modulated signal generating device 10 according to a first embodiment. FIG. 1 is a block diagram illustrating the modulated signal generating device 10 according to the first embodiment. The modulated signal generating device 10 superimposes an input signal Sin with a carrier signal Sca, and generates an output signal Sout representing a modulated signal.

1. Configuration of Modulated Signal Generating Device 10

The modulated signal generating device 10 includes an analog-to-digital (A/D) converting unit 100, an n-th control unit 20n (where n represents a natural number from 1 to N, and N represents a natural number equal to or greater than two), an m-th filter 30m (where m is a natural number from 1 to N−1), a carrier signal generating unit 400, Kn number of n-th amplifiers 501_1 to 501_Kn (where Kn represents a natural number), a combiner 600, and a bandpass filter 700.

1.1. A/D Converting Unit 100

The A/D converting unit 100 illustrated in FIG. 1 converts the input signal Sin into a reference signal S100 having a predetermined number of bits. The input signal Sin represents, for example, a modulated signal which is obtained by performing predetermined modulation having combination of one or more of amplitude modulation, frequency modulation, and phase modulation and which has a center frequency Fc. Although the following explanation is given for a case in which the input signal Sin represents a modulated signal, the input signal Sin is not limited to be a modulated signal. Alternatively, for example, the input signal Sin can be a voice signal or a data signal that is not subjected to modulation. In that case, the modulated signal generating device 10 can include a modulating unit (not illustrated) capable of performing predetermined modulation with respect to the reference signal S100.

1.2. First Control Unit 201 to N-Th Control Unit 20N

The modulated signal generating device 10 includes the first control unit 201 to the N-th control unit 20N. Herein, the first control unit 201 to the N-th control unit 20N generate a first control signal S201 to an N-th control signal S20N, respectively, for controlling the first amplifier 501 to the N-th amplifier 50N, respectively. When each of the first amplifier 501 to the N-th amplifier 50N is plural in number (the first amplifiers 501_1 to 501_K1, the second amplifiers 502_1 to 502_K2, . . . , and the N-th amplifiers 50N_1 to 50N_KN; where K1, K2, . . . , and KN are natural numbers); the first control unit 201 to the N-th control unit 20N generate a plurality of first control signals S201_1 to a plurality of N-th control signals S20N_KN, respectively, corresponding to the amplifiers. Moreover, the first control unit 201 to the N−1-th control unit 20(N−1) generate a first difference signal Sd1 to an N−1-th difference signal Sd(N−1), respectively, and output the signals to a first filter 301 to the N−1-th filter 30(N−1), respectively.

1.2.1. i-Th Control Unit 20i

Figure 2:
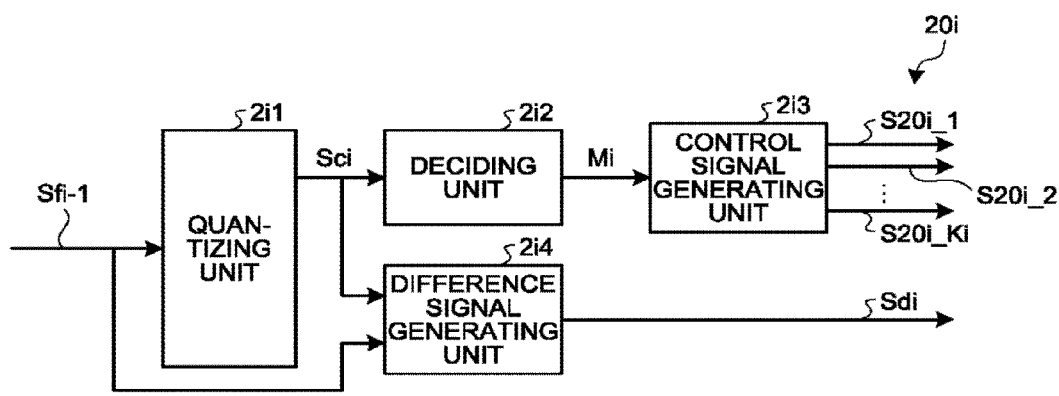
FIG. 2 is a block diagram illustrating an i-th control unit according to the first embodiment.
Figure 3:
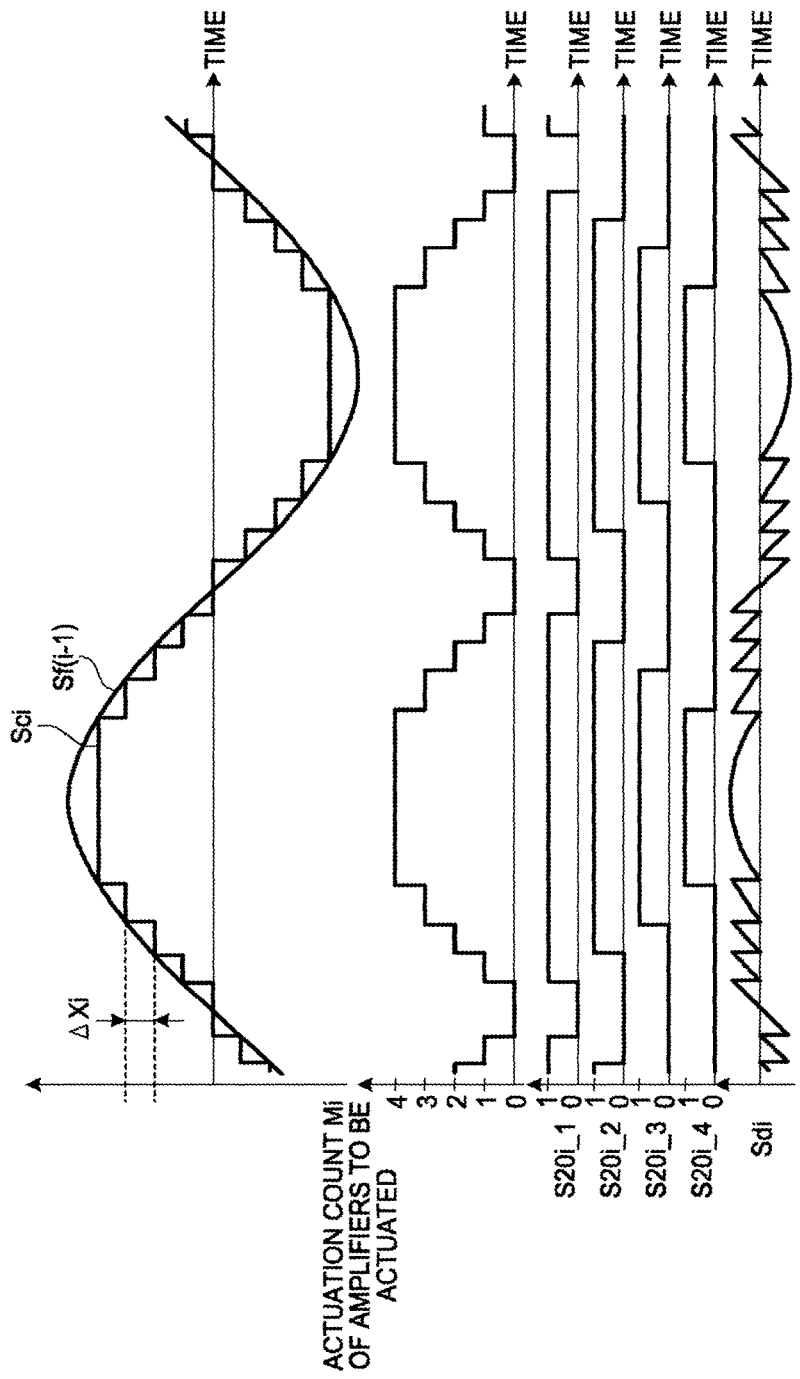
FIG. 3 is a diagram for explaining the constituent elements of the i-th control unit according to the first embodiment.

Explained below with reference to FIGS. 2 and 3 are the details of an i-th control unit 20i (where i=2 to N−1 holds true). FIG. 2 is a block diagram illustrating the i-th control unit 20i. FIG. 3 is a diagram for explaining the constituent elements of the i-th control unit 20i. The i-th control unit 20i includes a quantizing unit 2i1, a deciding unit 2i2, a control signal generating unit 2i3, and a difference signal generating unit 2i4.

1.2.1.1. Quantizing Unit 2i1

The quantizing unit 2i1 generates an i-th component signal Sci based on an i−1-th filtered signal Sf(i−1). The quantizing unit 2i1 performs a zero direction rounding operation in which the value of the i−1-th filtered signal Sf(i−1) (equivalent to the value of the i−1-th filtered signal Sf(i−1) as illustrated in FIG. 3) is rounded to the closest value to the zero direction among the integral multiples of a step width $\Delta Xi$, and generates the first component signal Sci. As illustrated in FIG. 3, the i-th component signal Sci is a step signal having "$\Delta Xi$" as the step width. The quantizing unit 2i1 outputs the generated i-th component signal Sci to the deciding unit 2i2 and the difference signal generating unit 2i4.

The following explanation is given about the step width $\Delta Xi$. Herein, the step width $\Delta Xi$ represents a value decided according to amplification factors A1 to AN of the first amplifier 501_1 to the N-th amplifier 50N_KN, respectively. The amplification factor An represents the amplification factor of each of the n-th amplifiers 50n_1 to 50n_Kn (where n is a natural number from 1 to N). If it is assumed that the i−1-th filtered signal Sf(i−1) can take a value in the range from −B to +B, that is, when the i−1-th filtered signal Sf(i−1) illustrated in FIG. 3 has the maximum value of B and the minimum value of −B; then the step width $\Delta Xi$ is expressed as $\Delta Xi = Ai \times B/(A1 \times K1 + A2 \times K2 + \ldots + AN \times KN)$.

1.2.1.2. Deciding Unit 2i2

The deciding unit 2i2 decides, based on the value of the i-th component signal Sci, the number of i-th amplified signals S50i_1 to S50i_Ki that are to be combined by the combiner 600, that is, the number of amplifiers from the i-th amplifiers 50i_1 to 50i_Ki that are actuated. In the example illustrated in FIG. 3, according to the value of the i-th component signal Sci, the deciding unit 2i2 varies an actuation count Mi of the i-th amplified signals S50i_1 to S50i_Ki as "2→1→0→1→2 . . . ". Then, the deciding unit 2i2 outputs the decided actuation count Mi to the control signal generating unit 2i3.

1.2.1.3. Control Signal Generating Unit 2i3

The control signal generating unit 2i3 decides, according to the actuation count Mi of the i-th amplifiers 50i_1 to 50i_Ki, the i-th amplifiers 50i_1 to 50i_Ki to be actuated. For example, the control signal generating unit 2i3 sequentially selects the Mi number of amplifiers from the i-th amplifier 50i_1 to the i-th amplifier 50i_Ki. Then, the control signal generating unit 2i3 generates the i-th control signals S20i_1 to S20i_Ki for actuating the selected amplifiers.

For example, in the example illustrated in FIG. 3, when the actuation count Mi is "2", the control signal generating unit 2i3 selects the i-th amplifiers 50i_1 and 50i_2 as the amplifiers to be actuated. Then, the control signal generating unit 2i3 generates the i-th control signals S20i_1 and S20i_2 for switching ON the selected i-th amplifiers 50i_1 and 50i_2, respectively; and generates the i-th control signals S20i_3 and S20i_4 for switching OFF the unselected i-th amplifiers 50i_3 and 50i_4, respectively.

The control signal generating unit 2i3 outputs the generated i-th control signals S20i_1 and S20i_Ki to the i-th amplifiers 50i_1 to 50i_Ki, respectively. Meanwhile, in FIG. 3 is illustrated an example in which there are four i-th amplifiers 50i, that is, an example in which Ki=4 holds true. However, the number of i-th amplifiers 50i_1 to 50i_Ki is not limited to four, and can be greater or smaller than four.

1.2.1.4. Difference Signal Generating Unit 2i4

The difference signal generating unit 2i4 generates an i-th difference signal Sdi that represents the difference between the i−1-th filtered signal Sf(i−1) and the i-th component signal Sci. More particularly, the difference signal generating unit 2i4 includes, for example, a subtractor (not illustrated) for subtracting the i-th component signal Sci from the i−1-th filtered signal Sf(i−1), and generates the i-th difference signal Sdi representing the error occurring due to the rounding operation performed by the quantizing unit 2i1. Then, the difference signal generating unit 2i4 outputs the generated i-th difference signal Sdi to the i-th filter 30i.

Meanwhile, when i=1 holds true, except for the fact that the signal input to a quantizing unit 211 is the reference signal S100 obtained by performing A/D conversion of the input signal Sin, the first control unit 201 has the identical configuration and operations to the i-th control unit 20i explained with reference to FIGS. 2 and 3. Hence, that explanation is not repeated. Moreover, when i=N holds true, except for the fact that the difference signal generating unit 2N4 is not included, the N-th control unit 20N has the identical configuration and operations to the i-th control unit 20i explained with reference to FIGS. 2 and 3. Hence, that explanation is also not repeated.

Meanwhile, herein, the explanation is given for a case in which the i-th control unit 20i includes the quantizing unit 2i1, the deciding unit 2i2, the control signal generating unit 2i3, and the difference signal generating unit 2i4. However, that is not the only possible case.

The first control signals S20i_1 to S20i_Ki and the i-th difference signal Sdi that are output by the i-th control unit 20i are uniquely determined according to the i−1-th filtered signal Sf(i−1) input to the i-th control unit 20i. Thus, for example, the i-th control unit 20i can be configured using a memory, in which the output signals (the first control signals S20i_1 to S20i_Ki and the i-th difference signal Sdi) corresponding to all patterns of the i−1-th filtered signal Sf(i−1) input to the i-th control unit 20i are stored, and using an encoder.

Meanwhile, in the case in which the step width used in the quantizing unit 2i1 satisfies the relationship of $\Delta Xi=2^L$ (where L is an arbitrary natural number) and in which the i−1-th filtered signal Sf(i−1) and the i-th difference signal Sdi are written in absolute value representation (i.e., a method of expression of digital signals in which the most significant bit represents the sign and the remaining lower bits represent the distance from zero), it becomes possible to simplify the operations of the quantizing unit 2i1, the deciding unit 2i2, and the difference signal generating unit 2i4.

For example, if the i−1-th filtered signal Sf(i−1) is expressed in P-bit absolute value representation, then the quantizing unit 2i1 can round off the lower L number of bits of the i−1-th filtered signal Sf(i−1) (i.e., overwrite all of the lower L number of bits to zero) and generate the i-th component signal Sci. Moreover, the deciding unit 2i2 can extract the P-L-1 number of bits excluding the most significant bit (the sign bit) of the i-th-component signal Sci, and accordingly decide the actuation count Mi of the i-th amplifiers 50i_1 to 50i_Ki to be actuated. Furthermore, the difference signal generating unit 2i4 can extract the L+1 number of bits by adding the most significant bit to the lower L number of bits of the i−1-th filtered signal Sf(i−1), and generate the i-th difference signal Sdi.

In the first control unit 201 to the N-th control unit 20N, there occurs a predetermined processing delay in the period of time starting from the input of the reference signal S100 or from the input of the first filtered signal Sf1 to the N−1-th filtered signal Sf(N−1), respectively, to the output of the first control signal S201_1 to the N-th control signal S20N_KN, respectively, and the first difference signal Sd1 to the N−1-th difference signal Sd(N−1), respectively. Moreover, in the first filter 301 to the N−1-th filter 30(N−1) too, there occurs a predetermined processing delay.

Herein, assume that Li represents the number of samples of the processing delay of the i-th control unit 20i and LFi represents the number of samples of the processing delay of the i-th filter 30i. Then, in order to synchronize the control signals from the first control signal S201_1 to the N-th control signal S20N_KN, it is desirable that the i-th control unit 20i outputs the first control signal S201_1 to the N-th control signal S20N_KN by delaying them by LSi=L(i+1)+L(i+2)+ . . . +L(N)+LF(i−1)+LFi+ . . . +LF(N−1). However, for ease of explanation, the following explanation is given under the assumption that there is no processing delay.

1.3 First Filter 301 to N−1-Th Filter 30(N−1)

As illustrated in FIG. 1, the modulated signal generating device 10 includes the first filter 301 to the N−1-th filter 30(N−1), which eliminate the harmonic component included in the first difference signal Sd1 to the N−1-th difference signal Sd(N−1), respectively, and generate the first filtered signal Sf1 to the N−1-th filtered signal Sf(N−1), respectively.

Figure 4:
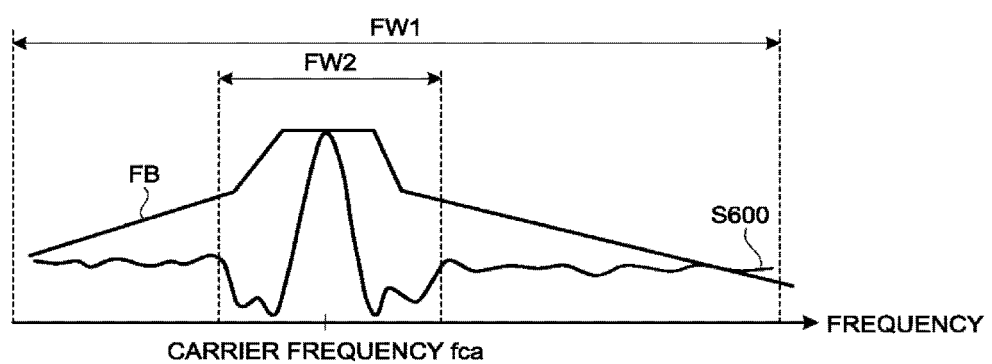
FIG. 4 is a diagram for explaining a first frequency range and a second frequency range according to the first embodiment.

Herein, for example, if it is assumed that the input signal Sin and the first component signal Sc1 are signals in a first frequency range FW1, then the first filter 301 to the N−1-th filter 30(N−1) limit the first difference signal Sd1 to the N−1-th difference signal Sd(N−1), respectively, to a second frequency range FW2 that is narrower than the first frequency range FW1; and generate the first filtered signal Sf1 to the N−1-th filtered signal Sf(N−1), respectively. As illustrated in FIG. 4, the first frequency range FW1 is, for example, a range including the frequency range for a combined signal S600 generated by the combiner 600. Moreover, for example, the second frequency range FW2 is a predetermined range including a transmission carrier frequency fca used for transmitting the input signal Sin, and represents a range including the pass band among the frequency characteristic of the bandpass filter 700.

In this way, the first filter 301 to the N−1-th filter 30(N−1) generate the first filtered signal Sf1 to the N−1-th filtered signal Sf(N−1), respectively, in the second frequency range FW2. a second control unit 202 to a N-th control unit 20N generate the second control signal S202 to the N-th control signal S20N_KN, respectively, based on the second component signal Sc2 to the N-th component signal ScN, respectively, included in the first filtered signal Sf1 to the N−1-th filtered signal Sf(N−1), respectively. For that reason, the second amplifier 502_1 to the N-th amplifier 50N_KN are actuated based on the second component signal Sc2 to the N-th component signal ScN, respectively, in the second frequency range FW2. As a result, the second amplifier 502_1 to the N-th amplifier 50N_KN can amplify the signals of the bandwidth passing through the bandpass filter 700 installed at a later stage, and can generate the modulated signal Sout with a high degree of accuracy. Meanwhile, FIG. 4 is a diagram for explaining the first frequency range FW1 and the second frequency range FW2.

Meanwhile, it is desirable that the m+1-th filter 30(m+1) has a higher cutoff frequency than the cutoff frequency of the m-th filter 30m. Higher the cutoff frequency, the smaller becomes the circuit size of the filter, and high-frequency signals get included in the filtered signal. If the cutoff frequency of the m+1-th filter 30(m+1) is set to be higher than the cutoff frequency of the m-th filter 30m, then the m+1-th filtered signal Sf(m+1) happens to include more high-frequency components as compared to the m-th filtered signal Sfm. That is, the m+1-th component signal Sc(m+1) included in the m+1-th filtered signal Sf(m+1) happens to include more high-frequency components than the m-th component signal Scm included in the m-th filtered signal Sfm.

Herein, if an amplifier is actuated based on a component signal including high-frequency components, then the amplifier operates at a high speed. Herein, smaller the amplification factor of an amplifier, the higher can be the speed of operations thereof. Thus, with the aim of actuating the m+1-th amplifier 50(m+1), which has a smaller amplification factor, at a higher speed than the m-th amplifier 50m having a higher amplification factor; the m+1-th control signals S20(m+1)_1 to S20(m+1)_K(m+1) are generated based on the m+1-th filtered signal Sf(m+1) in which more high-frequency components are included than in the m-th filtered signal Sfm. As a result, it becomes possible to reduce the circuit size of the first filter 301 to the N−1-th filter 30(N−1). Meanwhile, herein, it is assumed that the m+1-th amplifier 50(m+1) has a smaller amplification factor as compared to the m-th amplifier 50m, that is, it is assumed that the amplification factor goes on decreasing in the first amplifier 501, the second amplifier 502, . . . , and the N-th amplifier 50N in that order.

1.4. Carrier Signal Generating Unit 400

The carrier signal generating unit 400 generates the carrier signal Sca, whose value changes according to the sign (polarity) of the input signal Sin or the reference signal S100. The carrier signal Sca is used for the purpose of switching the polarity of the first amplified signal S501_1 to the N-th amplified signal S50N_KN that are output by the first amplifier 501_1 to the N-th amplifier 50N_KN, respectively. For example, the carrier signal generating unit 400 generates the carrier signal Sca having the value "+1" when the reference signal S100 is positive, and generates the carrier signal Sca having the value "−1" when the reference signal S100 is negative. In this way, the carrier signal generating unit 400 generates the carrier signal Sca having two values of "+1" and "−1" as polarity information of the reference signal S100. Then, the carrier signal generating unit 400 outputs the generated carrier signal Sca to the first amplifier 501_1 to the N-th amplifier 50N_KN.

Herein, although the carrier signal Sca is explained as a signal having two values of "+1" and "−1", that is not the only possible case. The carrier signal Sca can be generated according to an appropriate format tailored to the interfaces of the first amplifier 501_1 to the N-th amplifier 50N_KN. Moreover, in an identical manner to the input signal Sin, the carrier signal Sca can be input from the outside of the modulated signal generating device 10. In that case, the carrier signal generating unit 400 can be omitted.

1.5. First Amplifier 501_1 to N-Th Amplifier 50N_KN

The modulated signal generating device 10 includes the first amplifiers 501_1 to 501_K1 having an amplification factor A1; includes the second amplifiers 502_1 to 502_K2 having an amplification factor A2; . . . ; and includes the N-th amplifiers 50N_1 to 50N_KN having an amplification factor AN (where A1>A2> . . . >AN holds true). The amplification factors A1 to AN of the first amplifier 501_1 to the N-th amplifier 50N_KN are assumed to satisfy the following: A1=A; A2=($\frac{1}{2}$)$^1$A; A3=($\frac{1}{2}$)$^2$A; . . . ; and AN=($\frac{1}{2}$)$^{N-1}$A. Herein, A is a positive real value.

To the first amplifiers 501_1 to 501_K1 are input the first control signals S201_1 to S201_K1, respectively, and the carrier signal Sca. Upon receiving the input of the first control signals S201_1 to S201_K1 representing a notification of actuation, the first amplifiers 501_1 to 501_K1 output the first amplified signals S501_1 to S501_K1, respectively, having the positive polarity or the negative polarity according to the polarity of the carrier signal Sca. Meanwhile, when K1≥2 holds true, that is, when the first amplifiers 501_1 to 501_K1 are plural in number, the first amplifiers 501_1 to 501_K1 are assumed to be connected to each other in parallel. Meanwhile, the second amplifier 502_1 to the N-th amplifier 50N_KN have the same configuration as the configuration of the first amplifiers 501_1 to 501_K1. Hence, that explanation is not repeated.

1.6. Combiner 600

The combiner 600 illustrated in FIG. 1 combines the first amplified signal S501_1 to the N-th amplified signal S50N_KN that are output by the first amplifier 501_1 to the N-th amplifier 50N_KN, respectively; and generates the combined signal S600. Then, the combiner 600 outputs the generated combined signals S600 to the bandpass filter 700.

Alternatively, for example, the combiner 600 can perform weighted addition of the first amplified signal S501_1 to the N-th amplified signal S50N_KN at the ratio of A1:A2: . . . :AK, and generate the combined signal S600. In that case, the amplification factors A1 to AN of the first amplifier 501_1 to the N-th amplifier 50N_KN can be set to be identical to each other (i.e., A1=A2= . . . =AN holds true).

1.7. Bandpass Filter 700

The bandpass filter 700 is an analog filter that limits the combined signal S600, which is generated by the combiner 600, in a predetermined pass band and eliminates unnecessary distortion components. The bandpass filter 700 generates the modulated signal Sout.

2. Operations of Modulated Signal Generating Device 10

Figure 5:
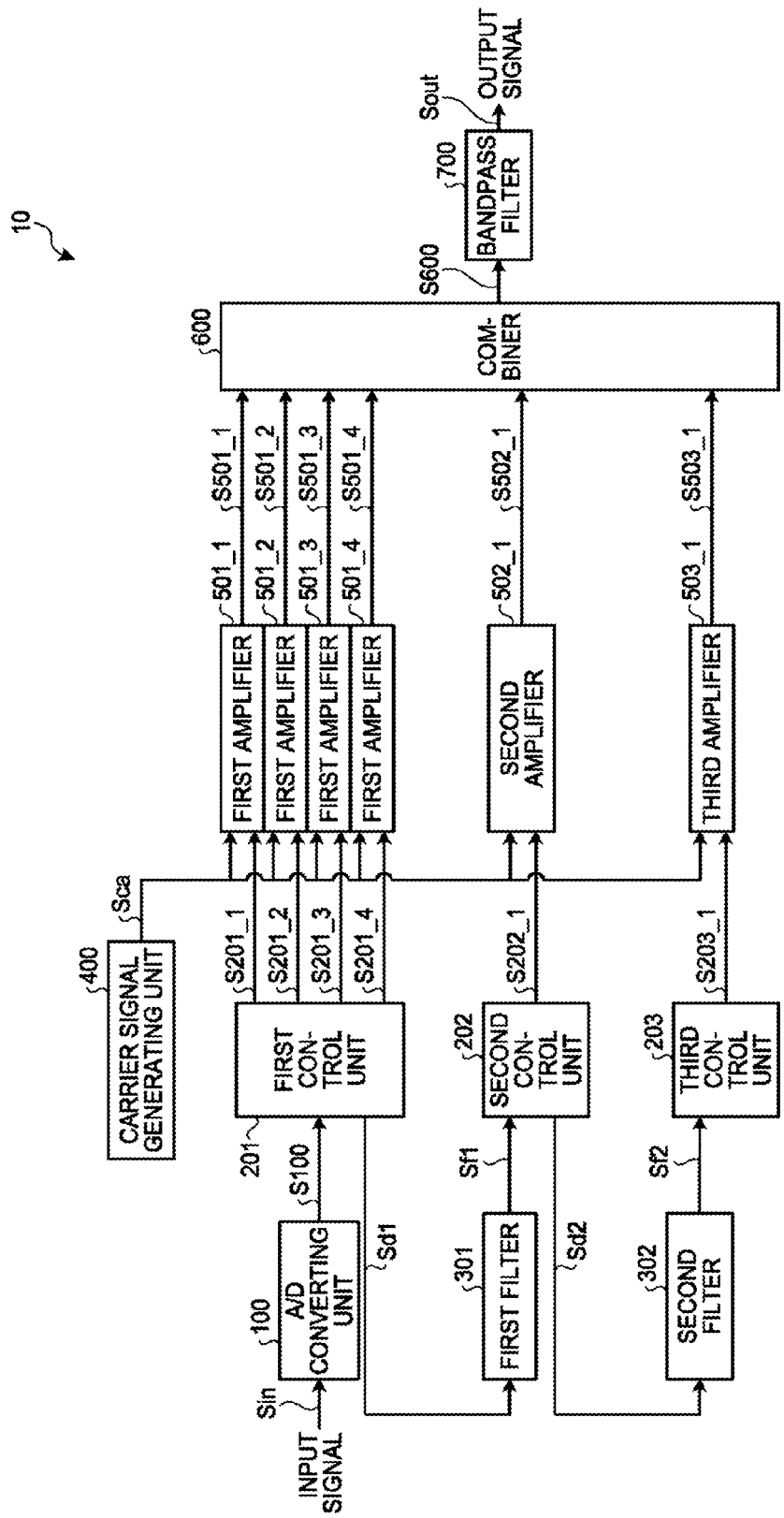
FIG. 5 is a diagram illustrating an exemplary configuration of the modulated signal generating device according to the first embodiment.
Figure 6:
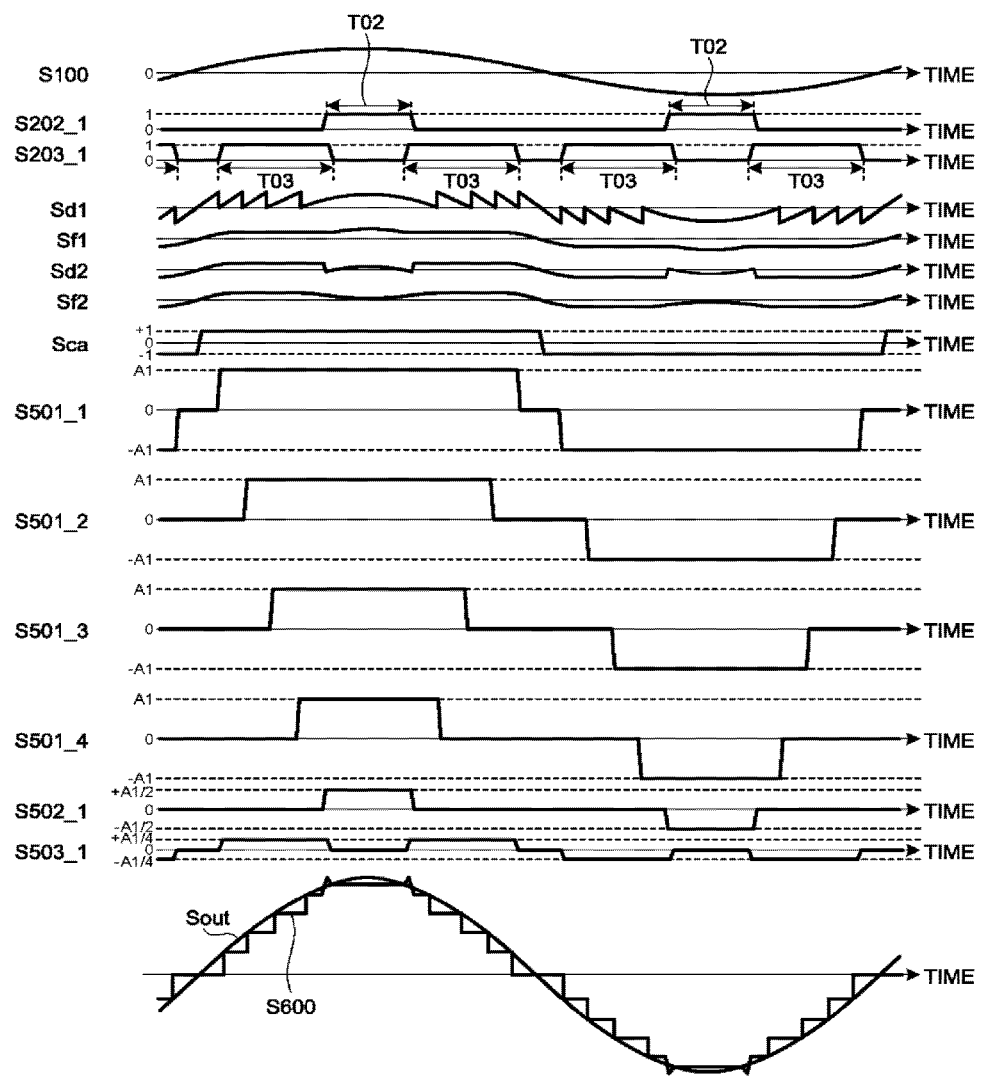
FIG. 6 is a diagram illustrating an example of the signals generated by the constituent elements of the modulated signal generating device according to the first embodiment.

Explained below with reference to FIGS. 5 and 6 are the operations performed by the modulated signal generating device 10 according to the first embodiment. FIG. 5 is a diagram illustrating an exemplary configuration of the modulated signal generating device 10. FIG. 6 is a diagram illustrating an example of the signals generated by the constituent elements of the modulated signal generating device 10. As illustrated in FIG. 5, for ease of explanation, it is assumed that N=3, K1=4, and K2=K3=1 holds true. That is, it is assumed that there are four first amplifiers 501_1 to 501_4, and there is a single second amplifier 502_1 and a single third amplifier 503_1. Moreover, it is assumed that the amplification factor A2 of the second amplifier 502_1 is half the amplification factor A1 of the first amplifiers 501_1 to 501_4, and that the amplification factor A3 of the third amplifier 503_1 is one-fourth of the amplification factor A1 of the first amplifiers 501_1 to 501_4 (i.e., A1=2A2=4A3 holds true).

The input signal Sin is input to the A/D converting unit 100 and is converted into the reference signal S100. Herein, it is assumed that the reference signal S100 illustrated in FIG. 5 has a single frequency and has a constant maximum value. The reference signal S100 is input to the first control unit 201.

The quantizing unit 211 of the first control unit 201 generates the first component signal Sc1 from the reference signal S100. The first component signal Sc1 has the same waveform as the waveform of the i-th component signal Sci illustrated in FIG. 3. Hence, the first component signal Sc1 is not illustrated in the drawings. Herein, the signals generated by the constituent elements of the first control unit 201 are same as the signal in the case of i=1 with reference to FIG. 3. Thus, the operations of the constituent elements of the first control unit 201 are explained with reference to FIG. 3.

As illustrated in FIG. 3, the deciding unit 212 of the first control unit 201 decides the number of the first amplifiers 501_1 to 501_4 to be actuated based on the first component signal Sc1. Herein, depending on the value of the first component signal Sc1, the deciding unit 212 varies an actuation count M1 of the first amplifiers 501_1 to 501_K1 as "2→1→0→1→2 . . . ".

a control signal generating unit 213 generates the first control signals S201_1 to S201_4 for actuating the first amplifiers equal to the count decided by the deciding unit 212. According to the variation "2→1→0→1→2 . . . " of the actuation count M1 of the first amplifiers 501_1 to 501_K1, the control signal generating unit 213 generates the first control signals S201_1 to S201_4. For example, when the actuation count M1 is "1", the control signal generating unit 213 generates one first control signal S201_1. Moreover, when the actuation count M1 is "1", the control signal generating unit 213 generates none of the first control signals S201_2 to S201_4 and thus performs control in such a way that the first amplifiers 501_2 to 501_4 do not get actuated.

The first control signals S201_1 to S201_4 are input to the first amplifiers 501_1 to 501_4, respectively. Moreover, the carrier signal Sca is also input to the first amplifiers 501_1 to 501_4. Herein, as illustrated in FIG. 6, the carrier signal Sca repeatedly switches between having the value "1" and having the value "−1" according to the polarity of the input signal Sin.

When the first control signals S201_1 to S201_4 have the value "1", the first amplifiers 501_1 to 501_4 multiplies the carrier signal Sca by the amplification factor A1 and generates the first amplifications signals S501_1 to S501_4. However, when the first control signals S201_1 to S201_4 have the value "0", the first amplifiers 501_1 to 501_4 are not actuated, that is, none of the first amplifiers 501_1 to 501_4 are generated. Herein, as illustrated in FIG. 6, the first amplifiers 501_1 to 501_4 generate the first amplified signals S501_1 to S501_4, respectively, either having "A1" of the positive polarity, or having "−A1" of the negative polarity, or having "0" according to the first control signals S201_1 to S201_4 and the polarity of the carrier signal Sca.

Moreover, the first control unit 201 illustrated in FIG. 5 generates the first difference signal Sd1 representing the difference between the reference signal S100 and the first component signal Sc1. As illustrated in FIG. 6, the first difference signal Sd1 becomes a signal including the harmonic component and undergoes a steep waveform fluctuation.

When the harmonic component is eliminated by the first filter 301, the first difference signal Sd1 gets converted into the first filtered signal Sf1 having a moderate waveform fluctuation and is then input to the second control unit 202. Then, a quantizing unit 221 of the second control unit 202 generates the second component signal Sc2 from the first filtered signal Sf1. Herein, the second component signal Sc2 having $\Delta X2$ in a section T02 and having zero in the other sections is generated.

Based on the second component signal Sc2, a deciding unit 222 of the second control unit 202 decides the number of second amplifiers 502_1 to be actuated. Herein, since there is only one second amplifier 502_1, the deciding unit 222 decides whether or not to actuate that second amplifier 502_1. More particularly, the deciding unit 222 decides to actuate the second amplifier 502_1 only in the section T02 but not in the other sections.

The control signal generating unit 223 of the second control unit 202 generates the second control signal S202_1 in such a way that the second amplifier 502_1 is actuated in the section T02 as decided by the deciding unit 222. For example, a control signal generating unit 223 generates the second control signal S202_1 having "1" in the section T02 and "0" in the other sections.

The second control signal S202_1 is input to the second amplifier 502_1. Moreover, the carrier signal Sca is also input to the second amplifier 502_1. When the second control signal S202_1 has the value "1", the second amplifier 502_1 multiplies the carrier signal Sca by A2=A1/2 and generates the second amplified signal S502_1. However, when the second control signal S202_1 has the value "0", the second amplifier 502_1 is not actuated, that is, the second amplifier 502_1 generates the second amplified signal S502_1 having the value "0". Herein, as illustrated in FIG. 6, the second amplifier 502_1 generates the second amplified signal S502_1 that has "A2=A1/2" of the positive polarity or has "−A2=−A1/2" of the negative polarity in the section T02 according to the polarity of the carrier signal Sca, but that has the value "0" in the other sections.

Then, the second control unit 202 illustrated in FIG. 5 generates a second difference signal Sd2 representing the difference between the first filtered signal Sf1 and the second component signal Sc2. As illustrated in FIG. 6, the second difference signal Sd2 becomes a signal including the harmonic component and undergoes a steep waveform fluctuation.

a second filter 302 eliminates the harmonic component so that the second difference signal S2 gets converted into the second filtered signal Sf2 having a moderate waveform fluctuation, and then the second filtered signal Sf2 is input to a third control unit 203. a quantizing unit 231 of the third control unit 203 generates a third component signal Sc3 from the second filtered signal Sf2. Herein, the third component signal Sc3 having $\Delta X3$ in a section T03 and having zero in the other sections is generated.

Based on the third component signal Sc3, the deciding unit 232 of the third control unit 203 decides the number of third amplifiers 503_1 to be actuated. Herein, since there is only one third amplifier 503_1, the deciding unit 232 decides whether or not to actuate that third amplifier 503_1. More particularly, the deciding unit 232 decides to actuate the third amplifier 503_1 in the section T03 but to not actuate third amplifier 503_1 in the other sections.

The control signal generating unit 233 of the third control unit 203 generates the third control signal S203_1 in such a way that the third amplifier 503_1 is actuated in the section T03 as decided by the deciding unit 232. For example, the control signal generating unit 233 generates the third control signal S203_1 having "1" in the section T03 and "0" in the other sections.

The third control signal S203_1 is input to the third amplifier 503_1. Moreover, the carrier signal Sca is also input to the third amplifier 503_1. When the third control signal S203_1 has the value "1", the third amplifier 503_1 multiplies the carrier signal Sca by A3=A1/4 and generates the third amplified signal S503_1. However, when the third control signal S203_1 has the value "0", the third amplifier 503_1 is not actuated, that is, the third amplifier 503_1 generates the third amplified signal S503_1 having the value "0". Herein, as illustrated in FIG. 6, the third amplifier 503_1 generates the third amplified signal S503_1 that has "A3=A1/4" of the positive polarity or "−A3=−A1/4" of the negative polarity in the section T03 according to the polarity of the carrier signal Sca, but that has the value "0" in the other sections.

The combiner 600 combines the first amplified signals S501_1 to S501_4, the second amplified signal S502_1, and the third amplified signal S503_1 into the combined signal S600. Then, the bandpass filter 700 limits the combined signal S600 to a predetermined pass band and converts it into the modulating signal Sout.

Figure 7:
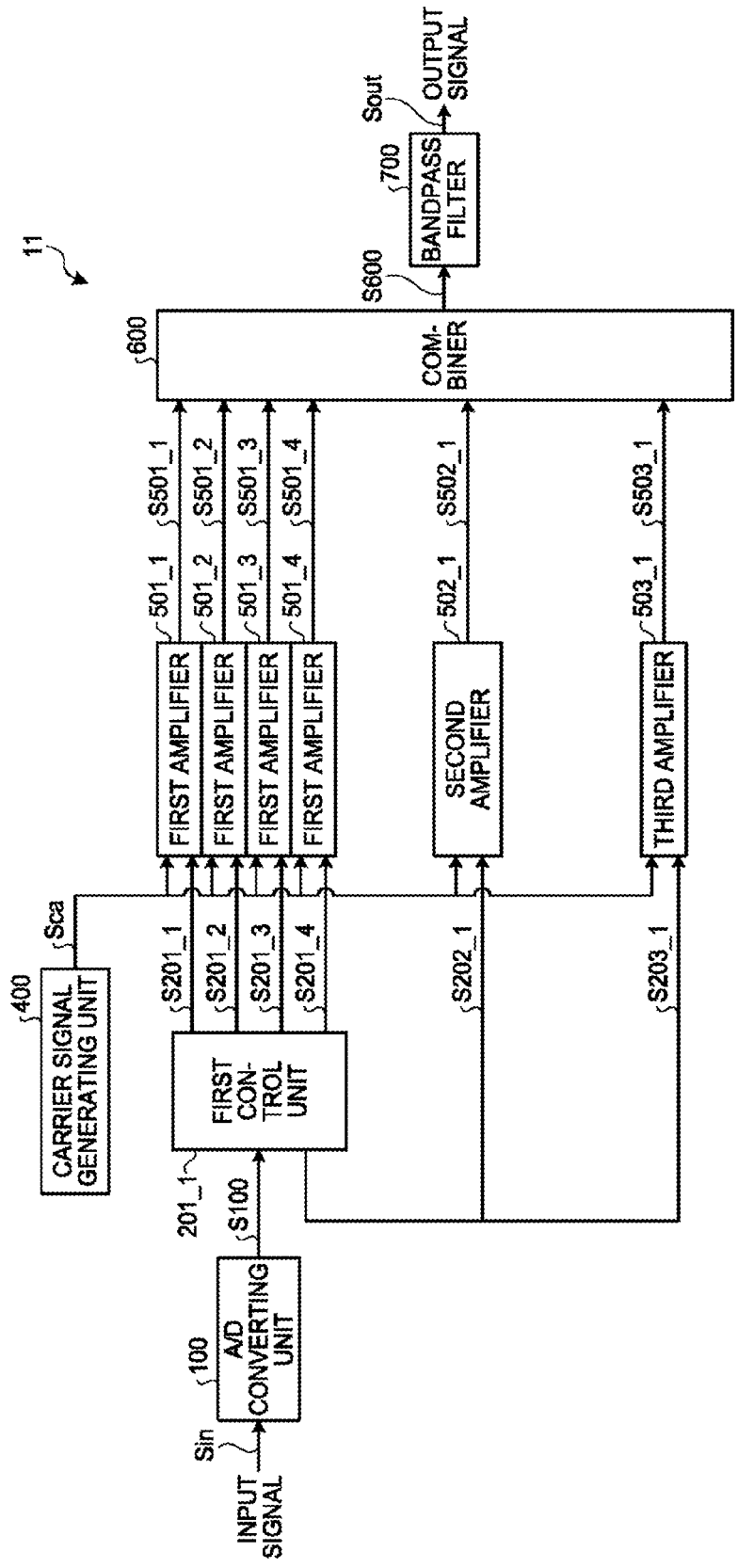
FIG. 7 is a diagram illustrating an exemplary configuration of a modulated signal generating device that does not include a first filter to an N−1-th filter according to the first embodiment.
Figure 8:
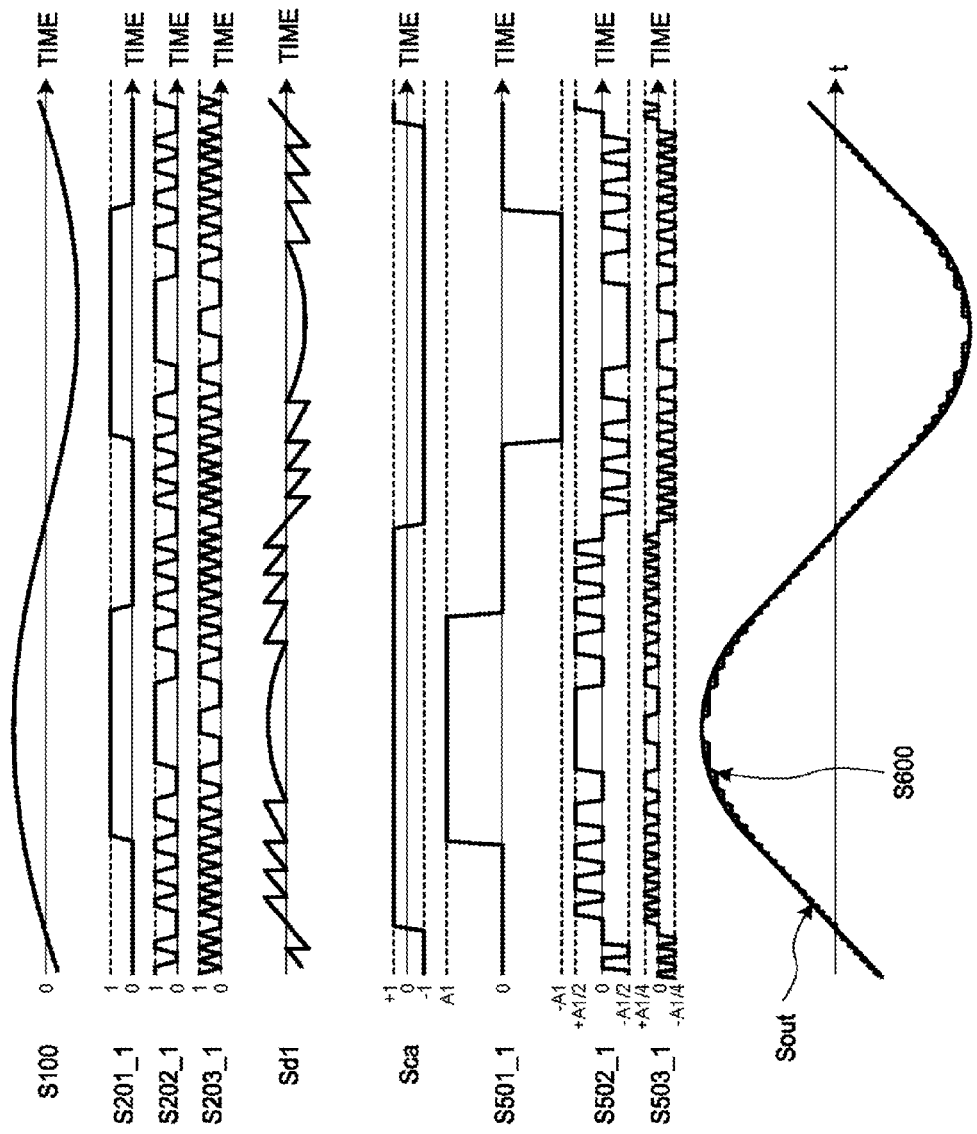
FIG. 8 is a diagram illustrating an example of the signals generated by the constituent elements of the modulated signal generating device that does not include the first filter to the N−1-th filter according to the first embodiment.

Explained below with reference to FIGS. 7 and 8 are the operations performed by the modulated signal generating device 10 according to the first embodiment in comparison with a modulated signal generating device 11 that does not include the first filter 301 to the N−1-th filter 30(N−1). FIG. 7 is a diagram illustrating an exemplary configuration of the modulated signal generating device 11 that does not include the first filter 301 to the N−1-th filter 30(N−1). FIG. 8 is a diagram illustrating an example of the signals generated by the constituent elements of the modulated signal generating device 11 that does not include the first filter 301 to the N−1-th filter 30(N−1). Apart from the fact that the first filter 301 to the N−1-th filter 30(N−1), the second control unit 202, and the third control unit 203 are not included; the modulated signal generating device 11 has the identical configuration and operations to the modulated signal generating device 10. Hence, the identical constituent elements and the identical signals are referred to by the same reference numerals, and their explanation is not repeated.

Meanwhile, in the first control unit 201_1 of the modulated signal generating device 11 illustrated in FIG. 7, it is assumed that the step width satisfies the relationship of $\Delta Xn=2^L$ and the first difference signal Sd1 is expressed in what is called the absolute value representation.

Herein, as described earlier, the first difference signal Sd1 generated by the first control unit 201_1 includes the harmonic component and undergoes a steep waveform fluctuation as illustrated in FIG. 8. Since the modulated signal generating device 11 illustrated in FIG. 7 does not include the first filter 301, the first control unit 201 sets the 1-bit signal at the L-th bit from the least significant bit of the first difference signal Sd1 as the second control signal S202_1. Thus, the first control unit 201_1 generates the second control signal S202_1 according to the steep waveform fluctuation of the first difference signal Sd1. For that reason, the second control signal S202_1 becomes a signal in which "0" and "1" are frequently repeated as illustrated in FIG. 8.

The second control signal S202_1 is input to the second amplifier 502_1. Then, the second amplifier 502_1 generates the second amplified signal S502_1 based on the second control signal S202_1. That is, the second amplifier 502_1 generates the second amplified signal S502_1 in which "A2=A1/2", "−A2=A1/2", and "0" are frequently repeated as illustrated in FIG. 8.

Subsequently, the first control unit 201_1 sets the 1-bit signal at the L−1-th bit from the least significant bit of the first difference signal Sd1 as the third control signal S203_1. For that reason, the first control unit 201_1 generates the third control signal S203_1 in which "0" and "1" are frequently repeated as illustrated in FIG. 8.

The third control signal S203_1 is input to the third amplifier S503_1. Then, the third amplifier S503_1 generates the third amplified signal S503_1 based on the third control signal S203_1. That is, the third amplifier 503_1 generates the third amplified signal S503_1 in which "A3=A1/4", "−A3=−A1/4", and "0" are frequently repeated as illustrated in FIG. 8.

The combiner 600 combines the first amplified signal S501_1 to the third amplified signal S503_1 and generates the combined signal S600. Moreover, the bandpass filter 700 limits the combined signal S600 to a predetermined pass band and generates the modulated signal Sout.

In this way, in the modulated signal generating device 11 illustrated in FIG. 7, the bits of the first difference signal Sd1, which undergoes a steep waveform fluctuation and which includes the harmonic component, are used as direction control signals for actuating the second amplifier 502_1 and the third amplifier 503_1. Hence, in the second and third amplified signals S502_1 and S503_1, "0" and "1" are frequently repeated as illustrated in FIG. 8. Thus, the second amplifier 502_1 and the third amplifier 503_1 repeatedly perform ON/OFF at high speeds, thereby resulting in an increase in the switching frequency of the second amplifier 502_1 and the third amplifier 503_1.

As a result of an increase in the switching frequency of the second amplifier 502_1 and the third amplifier 503_1, there is a possibility of an increase in the distortion of the second amplified signal S502_1 and the third amplified signal S503_1, respectively, due to the high-speed switching operations. The bandpass filter 700 is generally configured using an analog circuit. However, in the bandpass filter 700 configured using an analog circuit, it is difficult to obtain steep suppression characteristics in the frequency domain, and there is a possibility that the distortion in the vicinity of the pass band (i.e., in the vicinity of the center frequency Fc of the modulated signal Sout) cannot be sufficiently eliminated. Or else, in order to suppress the distortion in the vicinity of the pass band, it becomes necessary to use a high-order and sophisticated bandpass filter 700, thereby likely leading to an increase in the circuit size and the cost of the device.

In contrary, in the modulated signal generating device 10 according to the first embodiment, the harmonic components of the first difference signal Sd1 and the second difference signal Sd2 are eliminated using the first filter 301 and the second filter 302, respectively. Hence, the first filtered signal Sf1 and the second filtered signal Sf2 having a moderate waveform fluctuation are generated. As a result, as illustrated in FIG. 6, in the second amplified signal S502_1 and the third amplified signal S503_1, "0" and "1" are repeated in longer cycles as compared to the example illustrated in FIG. 8. With that, it becomes possible to hold down the switching frequency of the second amplified signal S502_1 and the third amplified signal S503_1.

As a result, in the modulated signal generating device 10 according to the first embodiment, it becomes possible to reduce the distortion of the second amplified signal S502_1 and the third amplified signal S503_1 that occurs due to the switching operations. Moreover, the bandpass filter 700 of a low order can be used, and an increase in the circuit size and the cost of the device can be held down.

The following explanation is given about the relationship between the cutoff frequencies F1 to F(N−1) of the first filter 301 to the N−1-th filter 30(N−1), respectively, and a cutoff frequency Fb of the bandpass filter 700.

Assume that the bandpass filter 700 has the cutoff frequency Fb, which is greater than the center frequency Fc of the input signal Sin (i.e., Fb>Fc holds true). In that case, the unnecessary waves that cannot be removed in the bandpass filter 700, that is, the unnecessary waves equal to or smaller than the frequency Fb happen to include the error component, which is attributed to insufficient amplitude resolution, and the distortion component, which is attributed to the switching operations.

The error component attributed to insufficient amplitude resolution can be reduced by using the k-th amplifiers $50k\_1$ to the $50k\_Kk$ (where k=2 to N holds true) having a small amplification factor. However, the k-th amplifiers $50k\_1$ to the $50k\_Kk$ perform operations based on the k−1-th filtered signal Sf(k−1) from which the signal components equal to or greater than the cutoff frequency Fk−1 have been eliminated by the k−1-th filter 30(k−1). Hence, the error component that can be reduced using the k-th amplifiers $50k\_1$ to $50k\_Kk$ (where k=2 to N holds true) having a small amplification factor is limited to the component in the frequency domain equal to or smaller than the cutoff frequency Fk. For that reason, in order to completely eliminate the error component attributed to insufficient amplitude resolution in the bandpass filter 700; it is desirable that the relationship of Fb≤Fk is satisfied.

On the other hand, if the cutoff frequency F(k−1) of the k−1-th filter 30 (k−1) increases, there is a possibility of an increase in the distortion component attributed to the switching operations. For that reason, if Mf(k−1) represents the maximum cutoff frequency of the k−1-th filter 30 (k−1) as acceptable to the k-th amplifiers $50k\_1$ to $50k\_Kk$, it is desirable that the relationship of F(k−1)≤MF(k−1) is satisfied.

Thus, it is desirable that the cutoff frequency Fk of the k-th filter 30k satisfies the relationship of Fb≤Fk≤MFk. Generally, smaller the output of an amplifier, the lesser is the likelihood that distortion occurs due to the switching operations. Hence, MFk becomes a value that monotonically increases with respect to "k". In that case, the cutoff frequency Fk can be set as a value that monotonically increases with respect to "k". Greater the cutoff frequency Fk, the higher is the concentration of impulse responses of the k-th filter 30k in a short period of time. Hence, it becomes possible to reduce the required tap count of the k-th filter 30k. That is, as a result of setting the cutoff frequency Fk to be a monotonically increasing value with respect to "k", it becomes possible to reduce the circuit size required for the digital computations in the modulated signal generating device 10.

Meanwhile, the k-th filter 30k need not always be installed with respect to all k-th difference signals Sdk. For example, the k-th filters 30k having a large "k" can be omitted.

As described above, in the modulated signal generating device 10 according to the first embodiment, the harmonic components of the first difference signal Sd1 to the N−1-th difference signal Sd(N−1) are eliminated using the first filter 301 to the N−1-th filter 30(N−1), respectively, and the switching frequency of the second amplifier 502_1 to the N-th amplifier 50N_KN can be reduced. As a result, it becomes possible to reduce the distortion of the second amplified signal S502_1 to the N-th amplified signal S50N_KN that is attributed to the switching operations. Moreover, the order of the bandpass filter 700 can be reduced, and an increase in the circuit size and the cost of the device can be held down.

Second Embodiment

Figure 9:
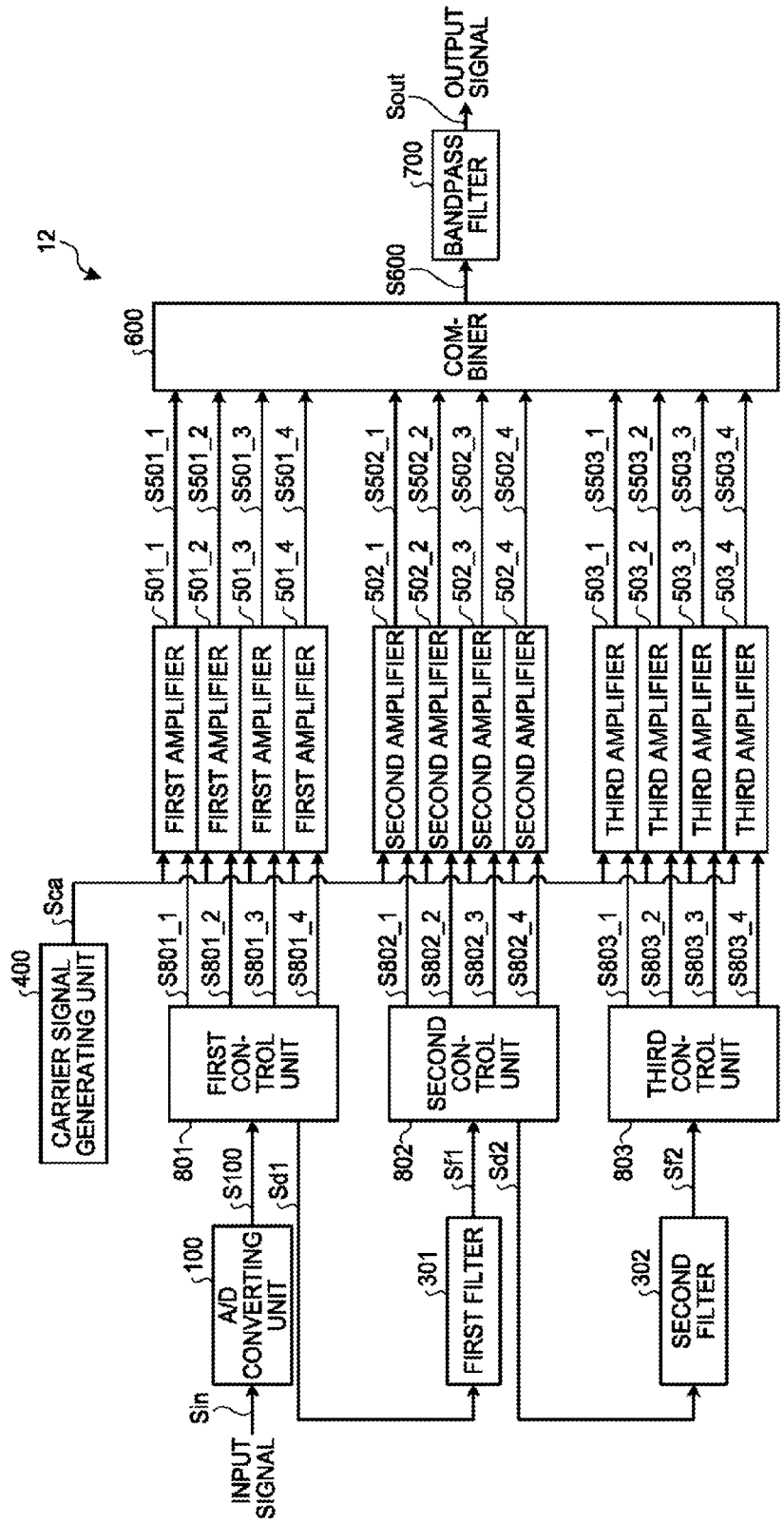
FIG. 9 is a diagram illustrating a configuration of a modulated signal generating device according to a second embodiment.
Figure 10:
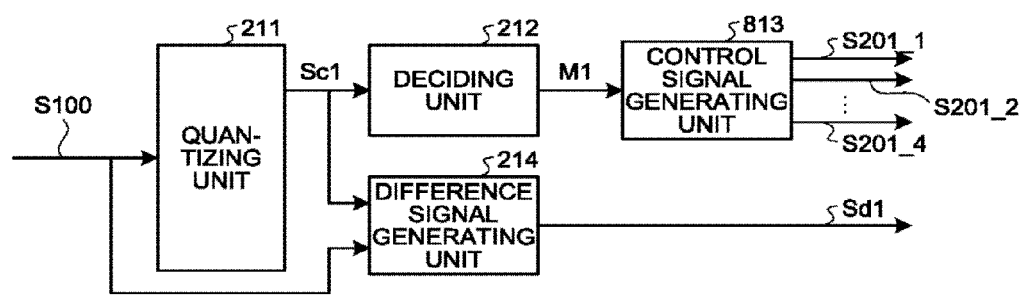
FIG. 10 is a diagram illustrating a configuration of a first control unit of the modulated signal generating device according to the second embodiment.

Explained below with reference to FIGS. 9 and 10 is a modulated signal generating device 12 according to a second embodiment. Herein, apart from including a control signal generating unit 8n3 of an n-th control unit 80n (where n=1 to N holds true), the modulated signal generating device 12 according to the second embodiment has the identical configuration and operations to the modulated signal generating device 10 illustrated in FIGS. 1 and 2. Hence, the same reference numerals are used and the explanation is not repeated. FIG. 9 is a diagram illustrating a configuration of the modulated signal generating device 12 according to the second embodiment. FIG. 10 is a diagram illustrating a configuration of a first control unit 801 of the modulated signal generating device 12.

Meanwhile, for ease of explanation, the following explanation is given for a case in which N=3 and K1=K2=K3=4 holds true. That is, as illustrated in FIG. 9, in the modulated signal generating device 12, the first amplified signal S501_1 to the third amplified signal S503_4 that respectively represent the output of the four first amplifiers S501_1 to S501_4, the four second amplifiers S502_1 to S502_4, and the four third amplifiers S503_1 to S503_4 are combined so that the input signal Sin is modulated into the modulated signal Sout.

In the modulated signal generating device 12, control signal generating units 813 to 833 of the first control unit 801 to the third control unit 803, respectively, select the first amplifier 501_1 to the third amplifier 503_4 to be actuated based on a plurality of orders of priority P. In that regard, the configuration is different than the control signal generating units 213 to 233 of the modulated signal generating device 10 that select the first amplifier 501_1 to the third amplifier 503_4 in a fixed order, that is, with a single order of priority P. The following explanation is given about the control signal generating unit 813 of the first control unit 801. a control signal generating unit 823 of a second control unit 802 and the control signal generating unit 833 of the third control unit 803 perform operations in an identical manner. Hence, the explanation thereof is not given.

3. Control Signal Generating Unit 813

The control signal generating unit 813 of the first control unit 801 illustrated in FIG. 10 varies the order of priority P at predetermined intervals and selects the first amplifiers 501_1 to 501_4 to be actuated. As a result, the first amplifiers 501_1 to 501_4 to be actuated can be avoided from getting concentrated in a particular amplifier, and the switching frequency for each of the first amplifiers 501_1 to 501_4 can be reduced.

Figure 11:
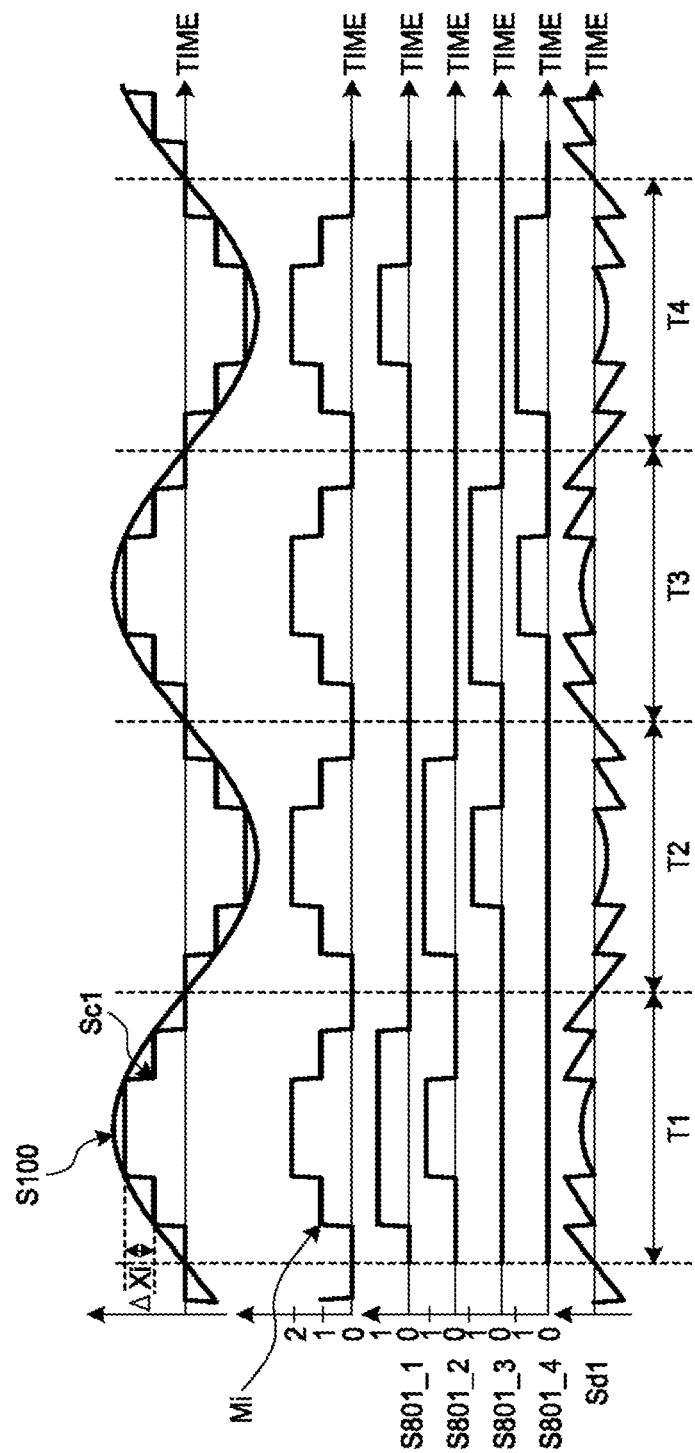
FIG. 11 is a diagram illustrating an example of the signals generated by the constituent elements of the modulated signal generating device according to the second embodiment.

Given below with reference to FIG. 11 is the specific explanation of a case in which the control signal generating unit 813 of the modulated signal generating device 12 decides, based on a plurality of orders of priority P_j (where j is a natural number) having different orders, the first amplifiers 501_1 to 501_4 to be actuated. FIG. 11 is a diagram illustrating an example of the signals generated by the constituent elements of the modulated signal generating device 12.

It is assumed that the control signal generating unit 813 stores a plurality of orders of priority P_j in, for example, a memory unit (not illustrated). For example, the order of priority P_j is expressed as a vector that has the elements in the form of numbers corresponding to the first amplifiers 501_1 to 501_4. For example, it is assumed that j=1, 2, 3, 4 holds true and orders of priority P_1 to P_4 are as follows: P_1={V1, V2, V3, V4}; P_2={V2, V3, V4, V1}; P_3={V3, V4, V1, V2}; and P_4={V4, V1, V2, V3}. Herein, V1, V2, V3, and V4 represent numbers corresponding to the first amplifiers 501_1, 501_2, 501_3, and 501_4, respectively.

The control signal generating unit 813 varies the order of priority P_j at, for example, predetermined intervals. In the example illustrated in FIG. 11, it is assumed that the control signal generating unit 813 selects the order of priority P_1 in a section T1, selects the order of priority P_2 in a section T2, selects the order of priority P_3 in a section T4, and selects the order of priority P_4 in a section T4. Moreover, by setting the section T1 as the subsequent section of the section T4, the control signal generating unit 813 varies the priority of order P_j in a cyclic manner.

More particularly, for example, the explanation is given about the method for selecting the first amplifiers 501_1 to 501_4 in the section T3. When the deciding unit 212 decides "2" as the actuation count of the first amplifiers 501_1 to 501_4, the control signal generating unit 813 follows the order of priority P_3 and selects the first amplifiers 501_3 and 501_4 as the amplifiers to be actuated. With the first amplifiers 501_3 and 501_4 decided as the amplifiers to be actuated, the control signal generating unit 813 generates the first control signals S801_3 and S801_4 having the value "1", for example. Moreover, with the first amplifiers 501_1 and 501_2 decided as the amplifiers not to be actuated, the control signal generating unit 813 generates the first control signals S801_1 and S801_2 having the value "0", for example. In this way, as a result of selecting the first amplifiers 501_1 to 501_4 based on a plurality of orders of priority P_j, it becomes possible to avoid a situation in which a particular amplifier is actuated in a concentrated manner.

Meanwhile, if only a single order of priority P is set (for example, the order of priority P_1), then the control signal generating unit 813 selects the amplifiers to be actuated in order from the first amplifier 501_1 regardless of the section. For that reason, when only a single order of priority P is set, the first amplifier 501_1 is readily selected as the amplifier to be actuated, and there is a risk of an increase in the switching operation of the first amplifier 501_1.

In that regard, the control signal generating unit 813 according to the second embodiment decides the amplifiers to be actuated from among a plurality of first amplifiers 501_1 to 501_4 based on the number of first amplified signals S501_1 to S501_4 to be combined and based on a plurality of orders of priority P_j. As a result, variability in the amplifiers to be actuated can be readily achieved, and an increase in the switching frequency of the first amplifiers 501_1 to 501_4 can be held down.

Meanwhile, a plurality of orders of priority P is not limited to the orders of priority P_j explained above. Moreover, in the example described above, although the control signal generating unit 813 sets the sections according to the polarity of the reference signal S100, the sections are not limited to that example.

For example, based on the number of first amplified signals S501_1 to S501_4 to be combined, based on the value of the first component signal Sc1, and based on the increase or decrease in the value of the first component signal Sc1; the control signal generating unit 813 can decide the first amplifiers to be actuated from among a plurality of first amplifiers 501_1 to 501_4. At that time, the amplifiers are actuated based on the order of priority P that corresponds to the pair of the sign (polarity) of the value and the sign (polarity) of the derivative value of the first component signal Sc1.

More particularly, for example, from among a plurality of orders of priority P1_j, an order of priority P1_1 corresponding to the pair having the positive sign for the derivative values in the reverse order of an order of priority P1_2 corresponding to the pair having the negative sign for the derivative values. That is, when P1_1={V1, V2, V3, V4} holds true, it implies that P1_2={V4, V3, V2, V1} holds true.

Meanwhile, a plurality of orders of priority P1_j need not always be in reverse order. For example, from among a plurality of orders of priority P1_j, the order of priority corresponding to different pairs can be different for each pair.

Alternatively, depending on the highest number of amplifiers from among the number of amplifiers decided in the previous section, the control signal generating unit 813 can vary the start position of the order of priority P_j in the current section. For example, in the example illustrated in FIG. 11, from among the number of amplifiers decided in the section T1, the highest number is "2". Thus, the control signal generating unit 813 varies the start position of the order of priority P_2 in the next section T2 according to the highest number "2". More particularly, the order obtained by adding the highest number "2" in the start position is set as the start position. In the example illustrated in FIG. 11, P_2={V2, V3, V4, V1} holds true. Thus, for example, if the number of amplifiers to be actuated is set to two, the control signal generating unit 813 sets V3 as the start position of the order of priority P_2 and decides the first amplifiers 501_3 and 501_4 corresponding to V3 and V4, respectively, as the amplifiers to be actuated.

In this way, in the modulated signal generating device 12, as a result of varying the start position of the order of priority P_j in the current section according to the actuation count of the first amplifiers 501_1 to 501_4 in the previous section, the amplifiers that were actuated in the previous section can be ongoingly kept actuated in the current section. With that, it becomes possible to elongate the pulse width of the first control signals S801_1 to S801_4; and the distortion of the first amplified signals S501_1 to S501_4 that is attributed to the switching of the first amplifiers 501_1 to 501_4 can be further reduced.

Meanwhile, although the explanation herein is given about a case of varying the start position of the order of priority P_j, it is alternatively possible to vary the start position of the order of priority P1_j, or the order of priority can be fixed to a single order of priority.

In this way, in the modulated signal generating device 12 according to the second embodiment, the first amplifier 501_1 to the third amplifier 503_4 to be actuated are selected based on the order of priority that is different for each predetermined interval. As a result, it becomes possible to avoid a situation in which a particular amplifier is actuated in a concentrated manner, and to further reduce the switching frequency for each of the first amplifier 501_1 to the third amplifier 503_4. That enables achieving reduction in the distortion of the first amplifier 501_1 to the third amplifier 503_4 occurring due to the switching operations.

Third Embodiment

Figure 12:
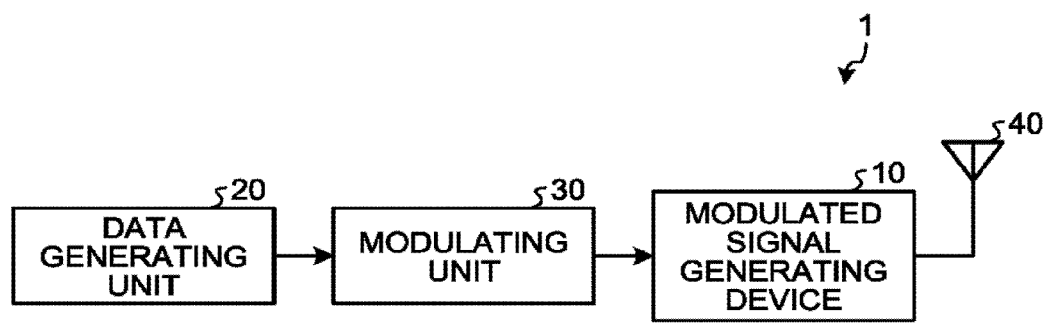
FIG. 12 is a diagram illustrating a wireless device according to a third embodiment.

FIG. 12 is a diagram illustrating a wireless device 1 according to a third embodiment. The wireless device 1 according to a third embodiment includes a data generating unit 20, a modulating unit 30, the modulated signal generating device 10, and an antenna unit 40. Herein, although the wireless device 1 includes the modulated signal generating device 10 according to the first embodiment, the wireless device 1 can alternatively include the modulated signal generating device 12 according to the second embodiment.

The data generating unit 20 follows an instruction from a higher layer and generates transmission data to be transmitted from the wireless device 1. Then, the data generating unit 20 outputs the generated transmission data to the modulating unit 30. Subsequently, the modulating unit 30 modulates the transmission data and generates a first modulated signal. For example, the modulating unit 30 illustrated in FIG. 12 performs amplitude modulation with respect to the transmission data and generates the first modulated signal. Then, the modulating unit 30 outputs the first modulated signal to the modulated signal generating device 10.

Upon receiving input of the first modulated signal, the modulated signal generating device 10 modulates the first modulated signal as the input signal Sin and generates the modulated signal Sout. The method by which the modulated signal generating device 10 generates the modulated signal Sout is same as the method according to the first embodiment. Hence, that explanation is not repeated. Then, the modulated signal generating device 10 outputs the generated modulated signal Sout as a second modulated signal to the antenna unit 40.

Upon receiving input of the second modulated signal, the antenna unit 40 transmits the second modulated signal via an antenna. With reference to FIG. 12, although the antenna unit 40 is configured to include only an antenna, that is not the only possible configuration of the antenna unit 40. Alternatively, for example, the antenna unit 40 can be configured to also include an amplifier and a filter.

As described above, in the wireless device 1 according to the third embodiment, the modulated signal generating device 10 modulates the first modulated signal. Hence, in an identical manner to the first embodiment, the circuit size and the size of the modulated signal generating device 10 can be reduced, thereby enabling achieving downsizing and cost reduction regarding the wireless device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A modulated signal generating device that modulates an input signal and generates a modulated signal, the modulated signal generating device comprising:
    a first amplifier that generates a first amplified signal based on a first control signal;
    a second amplifier that has a smaller amplification factor as compared to the first amplifier and that generates a second amplified signal based on a second control signal;
    a first control unit that generates the first control signal based on a first component signal included in the input signal;
    a first filter that eliminates harmonic component included in a first difference signal, which represents difference between the input signal and the first component signal, and generates a first filtered signal;
    a second control unit that generates the second control signal based on a second component signal included in the first filtered signal;
    a p-th amplifier (wherein p=3 to N, and N represents an integer equal to or greater than three) that has a smaller amplification factor than a p−1-th amplifier and that generates a p-th amplified signal based on a p-th control signal
    a p−1-th filter that eliminates harmonic component included in a p−1 th difference signal, which represents difference between a p−2-th component signal and a p−1-th component signal, and generates a p-th component signal;
    a p-th control unit that generates the p-th control signal based on the p-th component signal; and
    a combiner that combines the first amplified signal, the second amplified signal, and the p-th amplified signal to generate the modulated signal;
        wherein the p-th amplifier is plural in number, a plurality of the p-th amplifier is connected to each other in parallel, and each generates the p-th amplified signal, and the p-th control unit includes a p-th control signal generating unit that decides the p-th amplifier to be actuated from among a plurality of the p-th amplifier based on order of priority different for each predetermined interval and generates the p-th control signal for actuating the decided p-th amplifier.

2. The device according to claim 1, wherein
    the first control unit generates the first control signal based on the first component signal in a first frequency range, and
    the first filter limits the first difference signal in a second frequency range narrower than the first frequency range and generates the first filtered signal.

3. The device according to claim 2, wherein the first frequency range as well as the second frequency range is a range including a transmission carrier frequency for transmitting the input signal.

4. The device according to claim 1, wherein
    the first amplifier is plural in number,
    a plurality of the first amplifier is connected to each other in parallel, and each generates the first amplified signal, and
    the first control unit includes a first control signal generating unit that decides the first amplifier to be actuated from among a plurality of the first amplifier based on order of priority different for each predetermined interval and generates the first control signal for actuating the decided first amplifier.

5. The device according to claim 1, wherein
    the second amplifier is plural in number,
    a plurality of the second amplifier is connected to each other in parallel, and each generates the second amplified signal, and
    the second control unit includes a second control signal generating unit that decides the second amplifier to be actuated from among a plurality of the second amplifier based on order of priority different for each predetermined interval and generates the second control signal for actuating the decided second amplifier.

6. The device according to claim 1, wherein the p−1-th filter has a higher cutoff frequency than cutoff frequency of a p−2-th filter.

7. The device according to claim 1, wherein
    the first control unit generates the first control signal based on the first component signal in a first frequency range, and
    the p−1-th filter limits the first difference signal in a second frequency range narrower than the first frequency range and generates the first filtered signal.

8. A wireless device comprising:
    a signal generating unit that generates a transmission signal from transmission data;
    a modulating unit that modulates the transmission signal and generates a first modulated signal;
    a modulated signal generating device that modulates the first modulated signal and generates a second modulated signal; and
    an antenna unit that transmits the second modulated signal, wherein
    the modulated signal generating device includes:
        a first control unit that generates a first control signal based on a first component signal included in the first modulated signal;
        a first filter that eliminates harmonic component included in a first difference signal, which represents difference between the first modulated signal and the first component signal, and generates a first filtered signal;
        a second control unit that generates a second control signal based on a second component signal included in the first modulated signal;
        a first amplifier that generates a first amplified signal based on the first control signal;
        a second amplifier that has a smaller amplification factor as compared to the first amplifier and that generates a second amplified signal based on the second control signal;
        a p-th amplifier (wherein p=3 to N, and N represents an integer equal to or greater than three) that has a smaller amplification factor than a p−1-th amplifier and that generates a p-th amplified signal based on a p-th control signal;
        a p−1-th filter that eliminates harmonic component included in a p−1-th difference signal, which represents difference between a p−2-th component signal and a p−1-th component signal, and generates a p-th component signal;
        a p-th control unit that generates the p-th control signal based on the p-th component signal; and
        a combiner that combines the first amplified signal, the second amplified signal, and the p-th amplified signal to generate the second modulated signal;

wherein the p-th amplifier is plural in number, a plurality of the p-th amplifier is connected to each other in parallel, and each generates the p-th amplified signal, and the p-th control unit includes a p-th control signal generating unit that decides the p-th amplifier to be actuated from among a plurality of the p-th amplifier based on order of priority different for each predetermined interval and generates the p-th control signal for actuating the decided p-th amplifier.

* * * * *